United States Patent [19]

Gonzalez et al.

[11] Patent Number: 4,698,756
[45] Date of Patent: Oct. 6, 1987

[54] GENERATOR STATOR WINDING DIAGNOSTIC SYSTEM

[75] Inventors: Avelino J. Gonzalez, Forest Hills, Pa.; Franklin J. Murphy, Oviedo, Fla.; Franklin T. Emery, Orlando, Fla.; Perry A. Weyant, Winter Springs, Fla.; William G. Craig, Casselberry, Fla.

[73] Assignee: Westinghouse Electric Corp., Pittsburgh, Pa.

[21] Appl. No.: 755,513

[22] Filed: Jul. 16, 1985

[51] Int. Cl.$^4$ .......................... G01K 3/02; G01K 7/02; G01K 13/00; G06F 15/36
[52] U.S. Cl. ........................................ 364/557; 310/53; 340/501; 340/870.17; 364/551; 364/582
[58] Field of Search ............... 364/550, 551, 557, 494, 364/582; 340/501, 870.16, 870.17; 310/53, 64; 374/135, 152, 183, 185; 60/646, 657; 290/40 C

[56] References Cited

U.S. PATENT DOCUMENTS

| 3,955,359 | 5/1976 | Yannone et al. | 364/557 |
| 4,039,804 | 8/1977 | Reed et al. | 364/494 |
| 4,602,872 | 7/1986 | Emery et al. | 364/557 |

Primary Examiner—Felix D. Gruber
Attorney, Agent, or Firm—D. Schron

[57] ABSTRACT

A diagnostic system for an electrical generator winding which has first and second passages for conduction of cooling gas. The temperature of the gas exiting the passages is determined and converted to a normalized value which may be either high, low or normal. A diagnostic computer determines the existence of predetermined combinations of high, low or normal for the two readings and these predetermined combinations are utilized by the computer which generates respective confidence factors in the existence of certain abnormal generator conditions such as open conductors, broken or blocked cooling gas passages, and sensor malfunctions, by way of example.

14 Claims, 13 Drawing Figures

GENERATOR STATOR WINDING DIAGNOSTIC SYSTEM

BACKGROUND OF THE INVENTION

1. Field of the Invention

The invention in general relates to an on-line diagnostic system for an electric generator, and particularly to a generator of the gas-cooled variety.

2. Description of the Prior Art

Modern electric generators such as those driven by steam turbines have the capacity to carry several thousand amperes of current in their stator windings. Such arrangement generates a tremendous amount of heat due to the stator winding resistance as well as windage losses and accordingly, a cooling system must be provided so as to prevent generator overheating which may result from the heat production during normal operation.

One type of cooling system utilizes a flow of cooling gas, such as hydrogen, within the generator housing as well as within the rotor and stator structures to remove the produced heat. In one typical design, the generator stator core, made up of a plurality of thin laminations, has equally spaced longitudinal slots running the entire length of the core. Each slot is deep enough to accommodate two separately wound coil sections one on top of the other, each being known as a half coil, and cooling gas is passed through the coil sections themselves so as to define a gas inner-cooled arrangement.

In one gas inner-cooled design, two separate stacks of rectangular ventilation or vent tubes are positioned within each half coil to accommodate the cooling gas. A plurality of temperature sensors are provided to obtain temperature readings of the gas exiting from the vent tubes of selected half coils. Generally, for a multiphase machine, a pair of temperature sensors is utilized for each phase group of windings.

The temperature sensor outputs are monitored such that any abnormal reading or readings will indicate a possible problem with respect to a coil or coils within a phase group monitored by the sensors. Rather than compare each raw temperature output, it is more convenient to normalize the temperature readings. That is, a correction factor is generated for each sensor output reading for all particular load conditions of the generator such that for normal operation, each sensor output signal will be converted to a normalized percentage of average rise (PAR) signal equal to 100%. If the PAR exceeds a certain threshold level, for example, 105%, then the operator is provided with an alarm signal indicating a threshold has been exceeded.

Although this arrangement provides an operator with an indication that a problem may be arising, the problem itself is not specified nor is the fact that one of the temperature sensors themselves may be grossly in error. The present invention provides for a greatly improved diagnostic system for an electrical generator of the type described, wherein particular malfunctions, including sensor malfunctions, are specified to an operator so that corrective action, if any, may be taken.

SUMMARY OF THE INVENTION

Diagnostic apparatus is provided for a generator of the type described and includes a monitoring means for obtaining signals indicative of the temperature of the cooling gas which emerges from the two vent tubes of a selective winding to be monitored.

A diagnostic computer means is responsive to the temperature signals and is operable to generate corresponding first and second normalized temperature indicative signals and to determine whether these signals fall outside of a normal range. In particular, the determination is made as to whether the normalized temperature signals are below, within or above normal range.

The computer means is additionally operable to generate indications of the existence of predetermined combinations of the normalized signals which are in and out of the normal range to generate, in response to these different combinations, indications of predetermined possible abnormal conditions of the coil section being monitored. Means are provided for communicating any abnormal condition indication to an operator so that corrective action may be taken, if necessary.

In a preferred embodiment, belief in the existence of certain signal conditions and signal combinations is propagated through determination of the confidence in the existence of such conditions and the combinations so as to arrive at an abnormal condition indication having a certain degree of confidence associated with it. In this manner, if several abnormal conditions are indicated, an operator may act on the most likely ones.

DESCRIPTION OF THE PREFERRED EMBODIMENT

Figure 1:
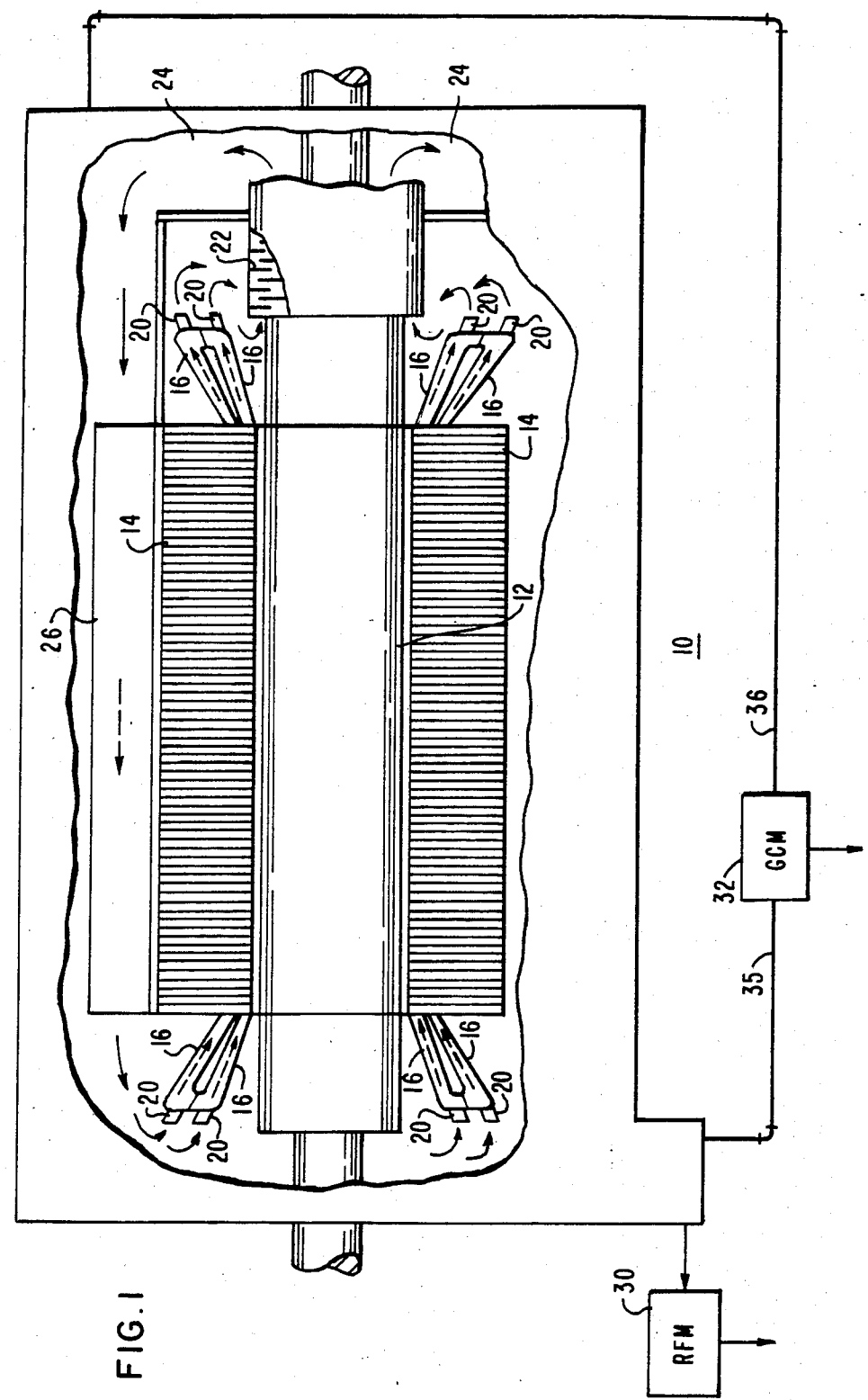
FIG. 1 is a simplified sectional view of an electric generator.

Generator 10 of FIG. 1 includes a rotor 12 which is surrounded by a stator 14 having a plurality of slots for receiving the stator windings, or coils. A number of coil sections, more particularly half coils 16 are simplistically illustrated, with each being electrically connected to another half coil occupying a different slot of the stator.

Cooling gas such as hydrogen enters the vent tube system 20 associated with each coil section 16 at the left-hand end of the sections, as presented in FIG. 1. The cooling gas removes heat generated during operation and emerges from the vent tube system 20 at the right-hand ends of the sections 16 from where it is forced by an axial compressor blower arrangement 22 into heat exchangers 24. The heated gas is again cooled and provided via ducts 26, one of which is shown, to the entrance of the vent tube system. Although not illustrated, hydrogen gas flow, indicated by the arrows, is also provided to passageways within the rotor 12 and stator core 14.

In addition to the utilization of a plurality of temperature detectors to be described, the present arrangement includes two other sensors, a radio frequency monitor (RFM) 30 as well as a generator condition monitor (GCM) 32. Arcing, which is generally a symptom associated with stator insulation or conductor failure can cause extensive damage within the generator. The small gap that may occur between metal surfaces as a result of the failure is the source of electrical arcing and measurement of radio frequency emission from the arcs is detectable by the RFM 30, the output signal of which may be utilized as one input in a diagnostic process. This sensor is a well-known commercially available item as is the GCM 32 which basically contains an ion chamber to detect thermally produced particulates in the hydrogen coolant of the generator, with the coolant being supplied to the GCM by gas conduit 35 and returned to the generator by means of gas conduit 36. High concentrations of submicron particles are produced whenever any organic material such as electrical insulation within the generator is heated enough to begin thermal decomposition. An output signal from the GCM indicative of this fact may also be utilized as another input in the diagnostic system.

Figure 2:
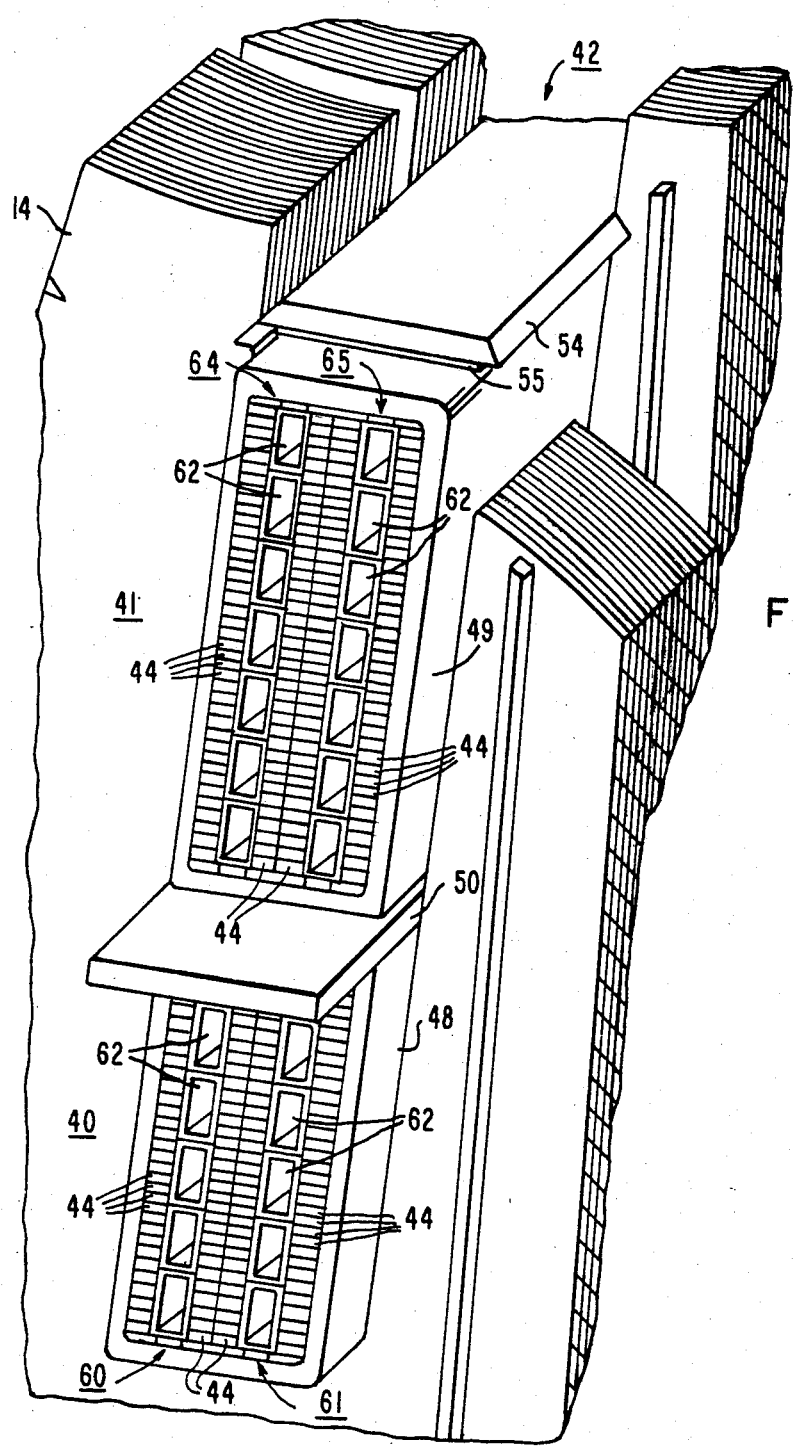
FIG. 2 is a sectional view illustrating two half coils arranged in a slot of the stator of the generator.

FIG. 2 illustrates two coil sections, a bottom half coil 40 and a top half coil 41 positioned within a slot 42 of the stator core 14. Each of the coils includes a plurality of insulated electrical conductors 44, also known as strands. The strands of each half coil are additionally surrounded by respective insulating layers 48 and 49 separated by spacing member 50, with the windings being held in position within the slot by means of a wedge 54 and ripple spring 55.

Strands 44 are disposed on either side of vent tube stacks which conduct hydrogen gas for cooling the coil sections. The bottom half coil 40 includes two vent tube stacks 60 and 61 each made up of a plurality of rectangular vent tubes 62. In a similar fashion, the top half coil 41 includes vent tube stacks 64 and 65 also being made up of a plurality of rectangular vent tubes 62.

Figure 3:
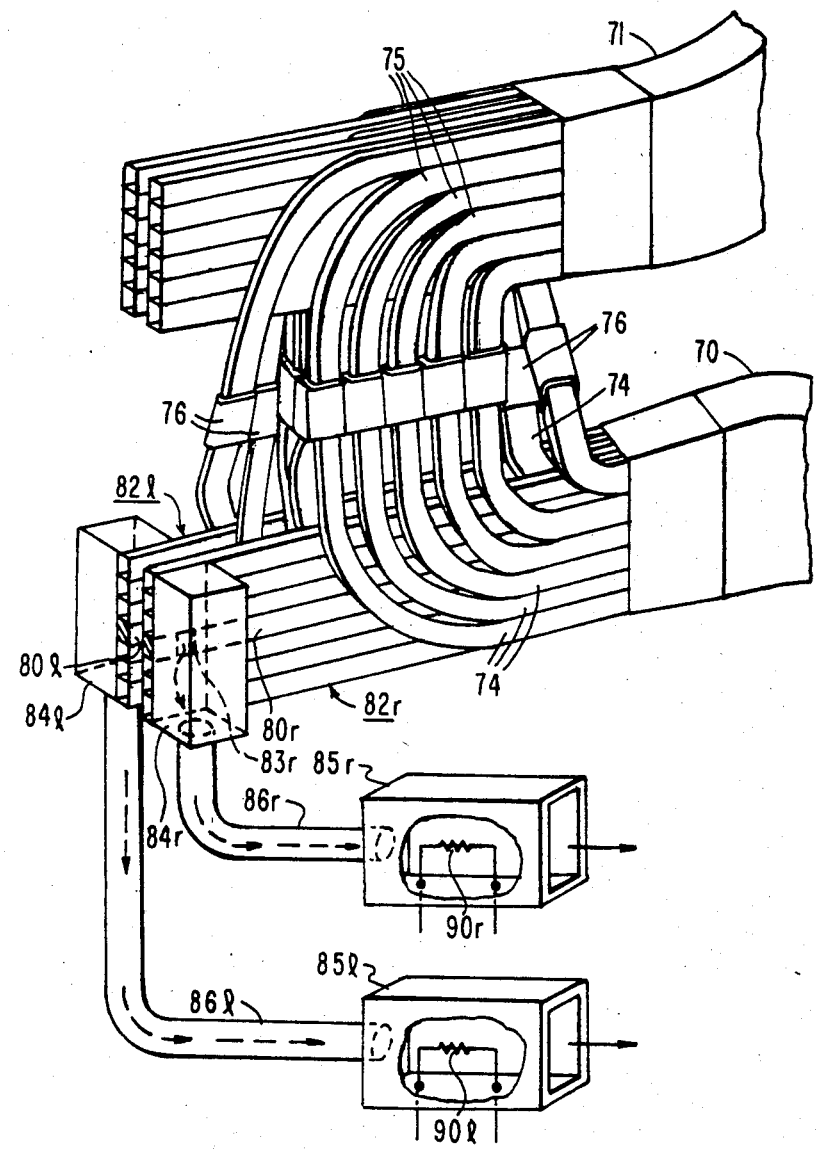
FIG. 3 is a view of the electrical joining of the ends of two half coils, together with vent tubes and temperature detectors.

FIG. 3 illustrates two coil sections in the form of half coils 70 and 71 located at the hydrogen discharge end of the stator. The strands of half coil 70 are brought out in respective conductor groups 74 and are electrically connected to conductor groups 75 of half coil 71 by means of soldered sleeve connectors 76.

In the prior art arrangement, as well as in the present invention, the hydrogen discharge from only one-half coil of each phase group is monitored. As illustrated in FIG. 3, this is accomplished by plugging up the end of one rectangular vent tube 80r of a right vent tube stack 82r and diverting the flow, via aperture 83r, into a first chamber 84r and then to a second chamber 85r by means of a gas conduit, also known as a hose, 86r.

Disposed within chamber 85r is a temperature sensing device 90r, and in one embodiment takes the form of a resistance-temperature-detector (RTD), a well-known type of detector which changes its resistance as a function of the temperature of the cooling gas passing over it. The gas exits from the second chamber 85r and enters the internal ambient atmosphere of the generator to be cooled and recirculated.

An identical arrangement is provided for the left vent tube stack and the identical components have been given the same reference numeral as those on the right side, however, with the letter designation 1.

Figure 4:
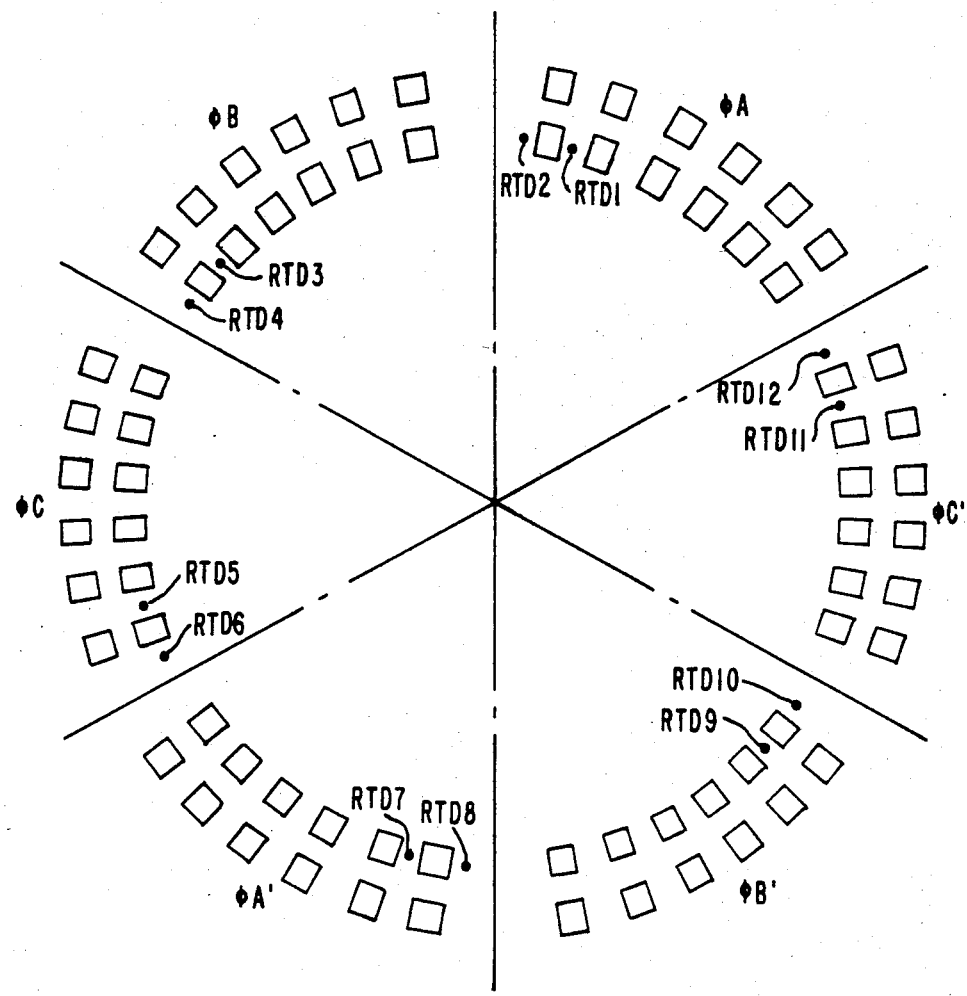
FIG. 4 serves to illustrate the various phases of the generator of FIG. 1 as well as the placement of temperature detectors.
Figure 5:
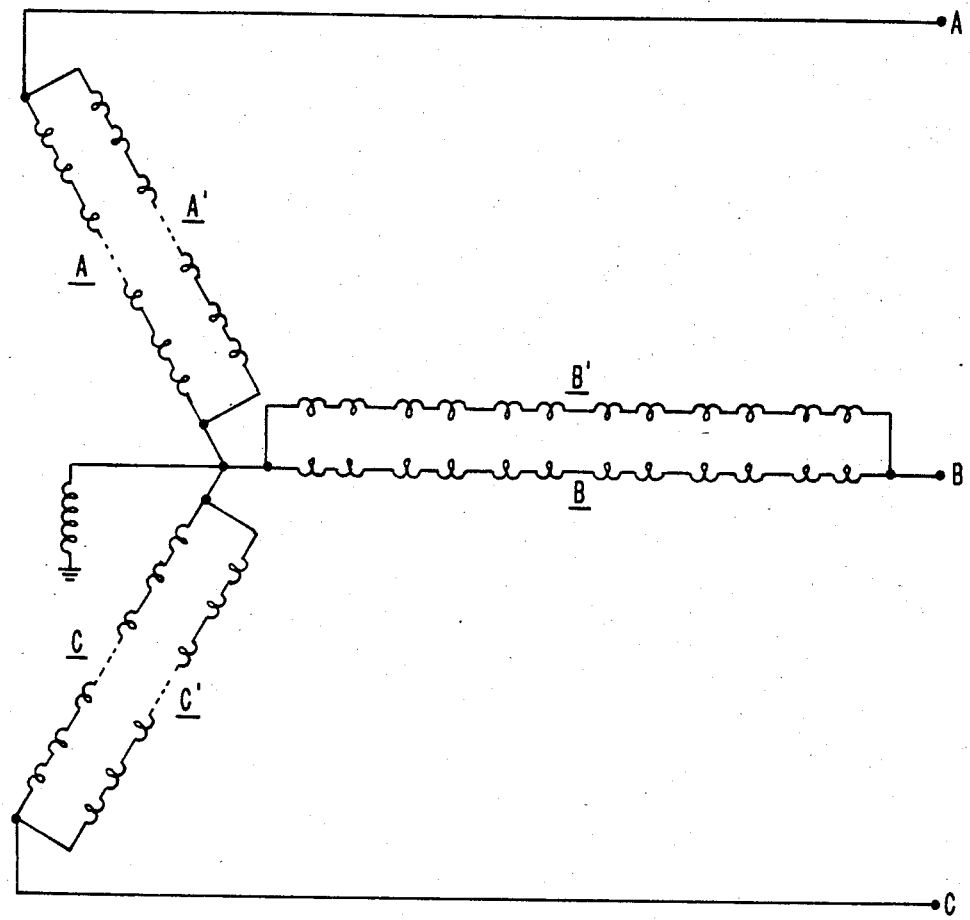
FIG. 5 is an electrical winding diagram illustrating the generator windings.

FIG. 4 is a simplified diagram of the stator windings for a three-phase machine as seen at the ends of the coil sections (illustrated as small squares). For the three-phase machine, there are six phase groups $\phi A$, $\phi A'$; $\phi B$, $\phi B'$; and $\phi C$, $\phi C'$. RTD's 1 and 2 monitor a single half coil of phase group $\phi A$, RTD's 3 and 4 monitor a single half coil of phase group $\phi B$, RTD's 5 and 6 monitor phase group $\phi C$, RTD's 7 and 8 monitor phase A' group $\phi A'$, RTD's 9 and 10 monitor phase group $\phi B'$ group and RTD's 11 and 12 monitor phase group $\phi C'$. The electrical equivalent of a typical generator winding with the six phase groups is illustrated in FIG. 5 wherein each of the six phase groups has twelve individual windings, each being constituted by a half coil section.

Figure 6A:
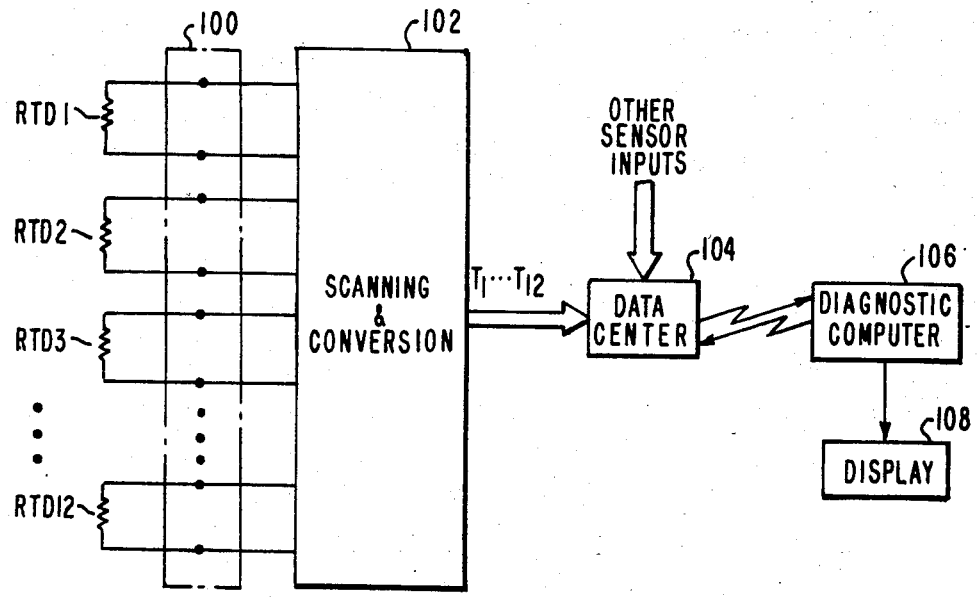
FIGS. 6A and 6B are block diagrams illustrating the obtaining of temperature readings and the transfer of these readings to diagnostic apparatus.
Figure 6B:
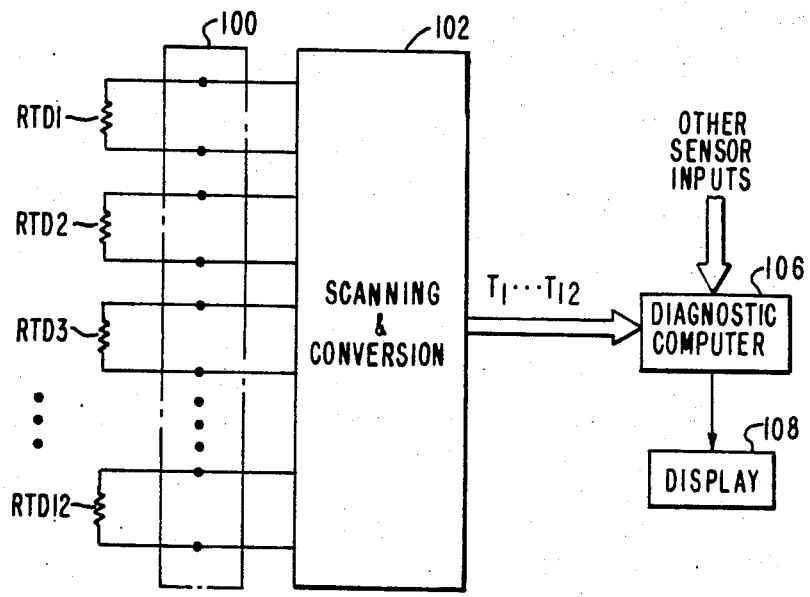

FIGS. 6A and 6B illustrate two methods by which the RTD data is provided to a diagnostic computer so that incipient malfunctions may be detected. In FIG. 6A, RTD's 1 to 12 are internal to the generator, as in FIG. 3, and leads from these detectors are brought out and connected to a terminal board 100. The respective terminals are connected to a scanning and conversion circuit 102 which periodically scans each resistance and converts it to a corresponding temperature indication $T_1$ to $T_{12}$. These temperature indications are outputted to a local data center 104 which periodically gathers not only the temperature indications but other sensor inputs from the plant including the RFM & GCM outputs. In this respect, the RTD may be considered as the detection portion of a temperature sensor which would include a portion of the electronics in the scanning and conversion circuitry 102.

In the embodiment of FIG. 6A, the data center 104 is operable periodically to transmit its gathered information to a remote location at which is located a diagnostic computer 106 operable to perform the necessary diagnostic operations so as to provide information relative to possible impending abnormal conditions to display apparatus 108, which may be a single display or various combinations including readouts such as printed information, color graphics, interactive color graphics, etc.

FIG. 6B is similar to FIG. 6A except that the diagnostic computer 106 is at the same plant location as the generator which is being monitored.

Figure 7:
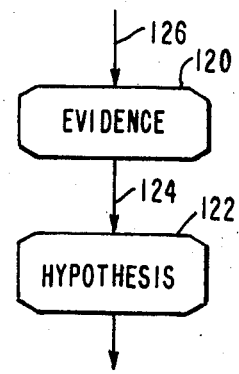
FIGS. 7 and 8 illustrate nodal diagrams utilized to explain one type of expert system which may be utilized in the operation of the present invention.

The diagnostic computer 106 in a preferred embodiment controls the diagnostic process by implementation of an expert system computer program that uses knowledge representations and inference procedures to reach conclusions normally determined by a human expert. A common form of knowledge representation is in the form of IF . . . THEN rules and one such system which may be utilized in the practice of the present invention is PDS (Process Diagnosis System) described in the proceedings of the Eighth International Joint Conference on Artificial Intelligence, August 8–12, 1983, pages 158–163. Basically, in that system (as well as other expert systems) for each rule there is an antecedent or evidence (the IF portion) as well as a consequent or hypothesis (the THEN portion) which can become evidence for other rules. As depicted in FIG. 7, evidence 120 is linked to the consequent hypothesis 122 by means of rule 124, with the evidence and hypothesis constituting nodes of the system. Numberal 126 represents a supporting rule of node 120, that is, a rule for which node 120 would be a hypothesis. Rule 124 is a supported rule of node 120, that is, a rule for which node 120 is evidence. Likewise, rule 124 is a supporting rule for node 122. In the system, by way of example, nodes can take the form of evidence, hypothesis, malfunctions, sensors and storage-nodes which are nodes capable of storing values input from other nodes and performing some predetermined mathematical operation on the values. In the figures, hypothesis (or evidence) nodes are octagonal, abnormal conditions are presented in a malfunction node and are illustrated as rectangles, sensor nodes are circular and storage nodes are trapezoidal.

Associated with each node is a measure of belief, MB, that the node (hypothesis) is true, as well as a measure of disbelief, MD, which is a measure of belief that the hypothesis is not true. Both factors range on a scale from 0 to 1 and the difference between them, MB−MD, yields a certainty or confidence factor CF which ranges from −1 to +1, where positive numbers represent confidence that the hypothesis is true and negative numbers represent the belief that the hypothesis is not true; numbers in the vicinity of 0 represent uncertainty.

An expert (or experts) in the field to which the diagnosis pertains establishes the various rules and relationships, which are stored in the computer's memory and utilized in the diagnostic process. The expert's belief in the sufficiency of the rule is also utilized. This belief, which represents the expert's opinion as to how the presence of evidence proves the hypothesis, is given a numerical representation designated as a sufficiency factor, SF, which ranges from −1 to +1, where positive values of SF denote that the presence of the evidence suggests that the hypothesis is true and negative values denote that the presence of the evidence suggests that the hypothesis is not true.

PDS additionally utilizes the expert's belief in the necessity of the rule, which illustrates to what degree the presence of the evidence is necessary for the hypothesis to be true. This necessity belief is given a numeral representation designated as a necessity factor NF which ranges from −1 to +1, where positive values of NF denote that the absence of evidence suggests that the hypothesis is not true and negative values denote that the absence of the evidence suggests that the hypothesis is true.

Figure 8:
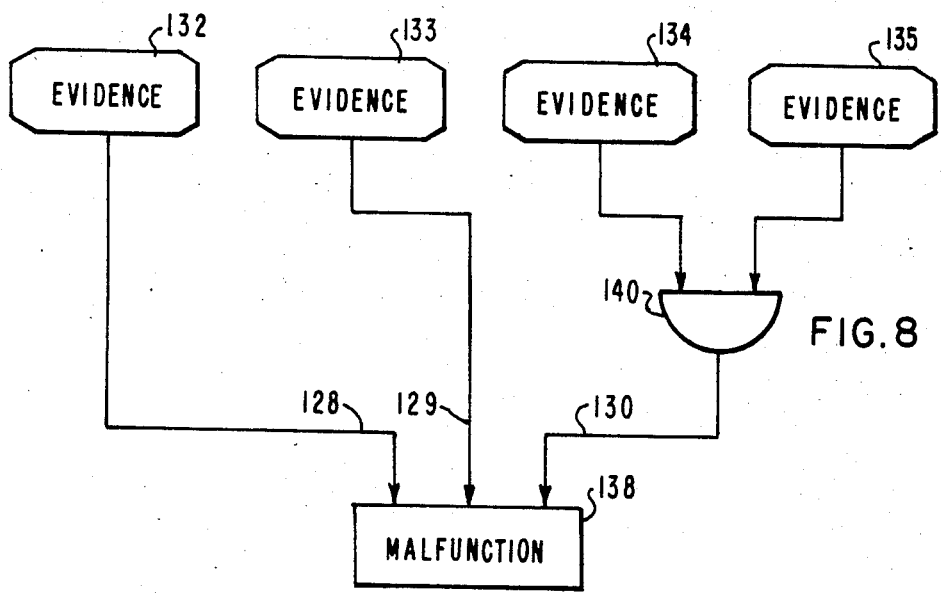

FIG. 8 illustrates another common arrangement wherein a plurality of rules 128 to 130 connect evidence nodes 132 to 135 to a malfunction node 138. Element 140 represents the combining of evidence in (a) a disjunctive manner, that is, if evidence 134 OR 135 is present, or (b) in a conjunctive manner, that is, if evidence 134 AND 135 are present.

Belief leading to a consequent malfunction in the system being diagnosed is propagated from evidence to hypothesis in repetitive cycles, at the beginning of which the CF, MB and MD values of each node are reset to zero (except for a sensor node where the MB and accordingly the CF is assumed to be +1).

If the CF of the evidence is positive, then the rule's sufficiency is utilized to propagate belief, whereas if the CF of the evidence is negative, the rule's necessity is utilized; if CF is zero, nothing is done.

Basically, if the evidence CF is positive and the SF is positive, then the MB of the hypothesis is increased; if the SF is negative, then the MD of the hypothesis is increased.

Conversely, if the evidence CF is negative, and the NF positive, then the MD of the hypothesis is increased, and if the NF is negative, the MB of the hypothesis is increased. By way of example, for the single rule case of FIG. 7, if MB and MD are the belief and disbelief in the rule's hypothesis, CF the confidence in the rule's evidence, and SF and NF are the rule's sufficiency and necessity, then:

if $CF > 0$ and $SF > 0$: (1)

$$MB = CF \times SF$$

$MD$ is not changed if $CF > 0$ and $SF < 0$: (2)

$$MD = CF \times (-SF)$$

$MB$ is not changed if $CF < 0$ and $NF > 0$: (3)

$$MD = (-CF) \times NF$$

$MB$ is not changed if $CF < 0$ and $NF < 0$: (4)

$$MB = CF \times NF$$

$MD$ is not changed

For the multiple rule case of FIG. 8, final values are obtained by examining each rule in sequence and performing the calculations for each rule in accordance with the following, where $MB_{old}$ and $MD_{old}$ are the belief and disbelief in the rule's hypothesis (malfunction) before each calculation, CF the confidence in the rule's evidence, SF and NF are the rule's sufficiency and necessity and $MB_{new}$ and $MD_{new}$ are the belief and disbelief in the rule's hypothesis (malfunction) after each calculation:

if $CF > 0$ and $SF > 0$: (5)

$$MB_{new} = MB_{old} + (1 - MB_{old}) \times CF \times SF$$

$$MD_{new} = MD_{old}$$

if $CF > 0$ and $SF < 0$: (6)

$$MD_{new} = MD_{old} + (1 - MD_{old}) \times CF \times (-SF)$$

$$MB_{new} = MB_{old}$$

if $CF < 0$ and $NF > 0$: (7)

$$MD_{new} = MD_{old} + (1 - MD_{old}) \times (-CF) \times NF$$

$$MB_{new} = MB_{old}$$

if $CF < 0$ and $NF < 0$: (8)

$$MB_{new} = MB_{old} + (1 - MB_{old}) \times CF \times NF$$

$$MD_{new} = MD_{old}$$

For a disjunctive logical node (OR function) the highest confidence factor of all of the pieces of evidence may be utilized or the CF may be obtained by subtracting the minimum MD from the maximum MB. If the logical node is conjunctive (AND function) the minimum of all of the confidence factors may be utilized or the CF may be obtained by subtracting the maximum MD from the minimum MB. Alternatively, weighted averages may be utilized for the OR and AND functions.

The AND and OR functions are not digital (ONE or ZERO) in nature and the logic utilized is known as fuzzy logic. Accordingly as utilized herein fuzzy logic AND and OR functions are designated FAND and FOR respectively whereas weighted AND and OR functions are designated WAND and WOR respectively.

Thus, by utilizing the appropriate previous equations, a measure of belief and/or disbelief is calculated for a hypothesis and from these values a confidence factor in the hypothesis is calculated from the relationship CF=MB−MD.

Figure 9A:
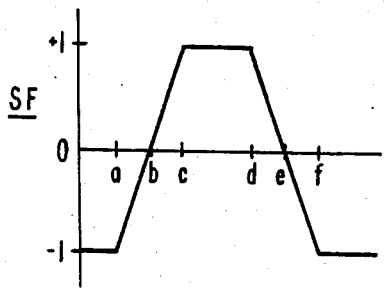
FIGS. 9A and 9B serve to illustrate typical functions which may be utilized in the expert system.
Figure 9B:
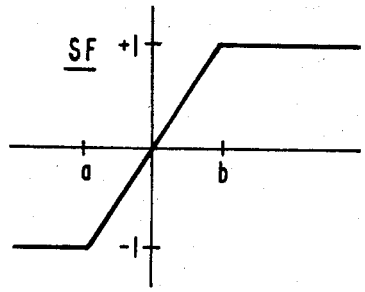

A rule's sufficiency (SF) or necessity (NF) may in many instances be expressed as a constant. In other instances, the sufficiency and/or necessity may be expressed as some other function which will generate a sufficiency or necessity factor of a fixed number by evaluating the function for a particular variable. A common function which may be utilized is a piece-wise linear function, two examples of which are illustrated in FIGS. 9A and 9B. The Y-axis in these figures represent the SF (or NF) ranging from −1 to +1 on the vertical scale. The X-axis horizontal scale represents the value of some variable such as a sensor reading or the result of some mathematical operation, by way of example. In FIG. 9A, if the variable has a value between 0 and a, or is greater than f, it will generate an SF of −1 whereas if the value is between c and d, it will generate an SF of +1. Values between a and c or d and f will generate corresponding SF's between −1 and +1.

FIG. 9B represents a piece-wise linear function wherein any variable value greater than b will generate an SF of +1, any variable value less than −b will generate an SF of −1 and values between −b and +b will generate a corresponding SF between −1 and +1.

Another type of useful rule is a reading-transform rule which, when carried out, applies a transform function to the value found in the rule's evidence node. If the evidence node is a sensor, the value is a sensor reading, with appropriate conversion, scaling, etc., performed by the transform if needed.

Figure 10A:
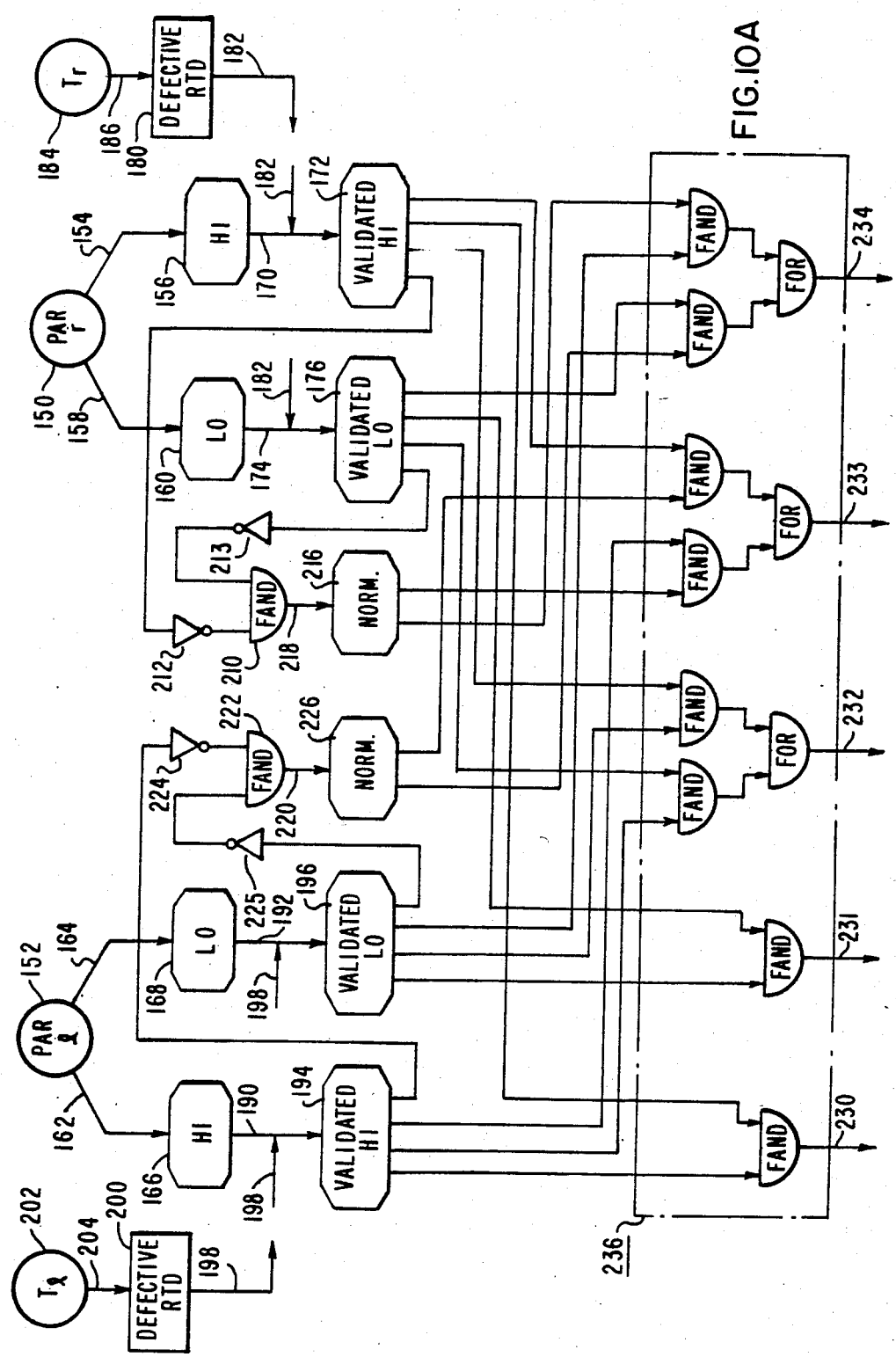
FIGS. 10 (A & B) taken together are a flow diagram illustrating operation of the present invention.
Figure 10B:
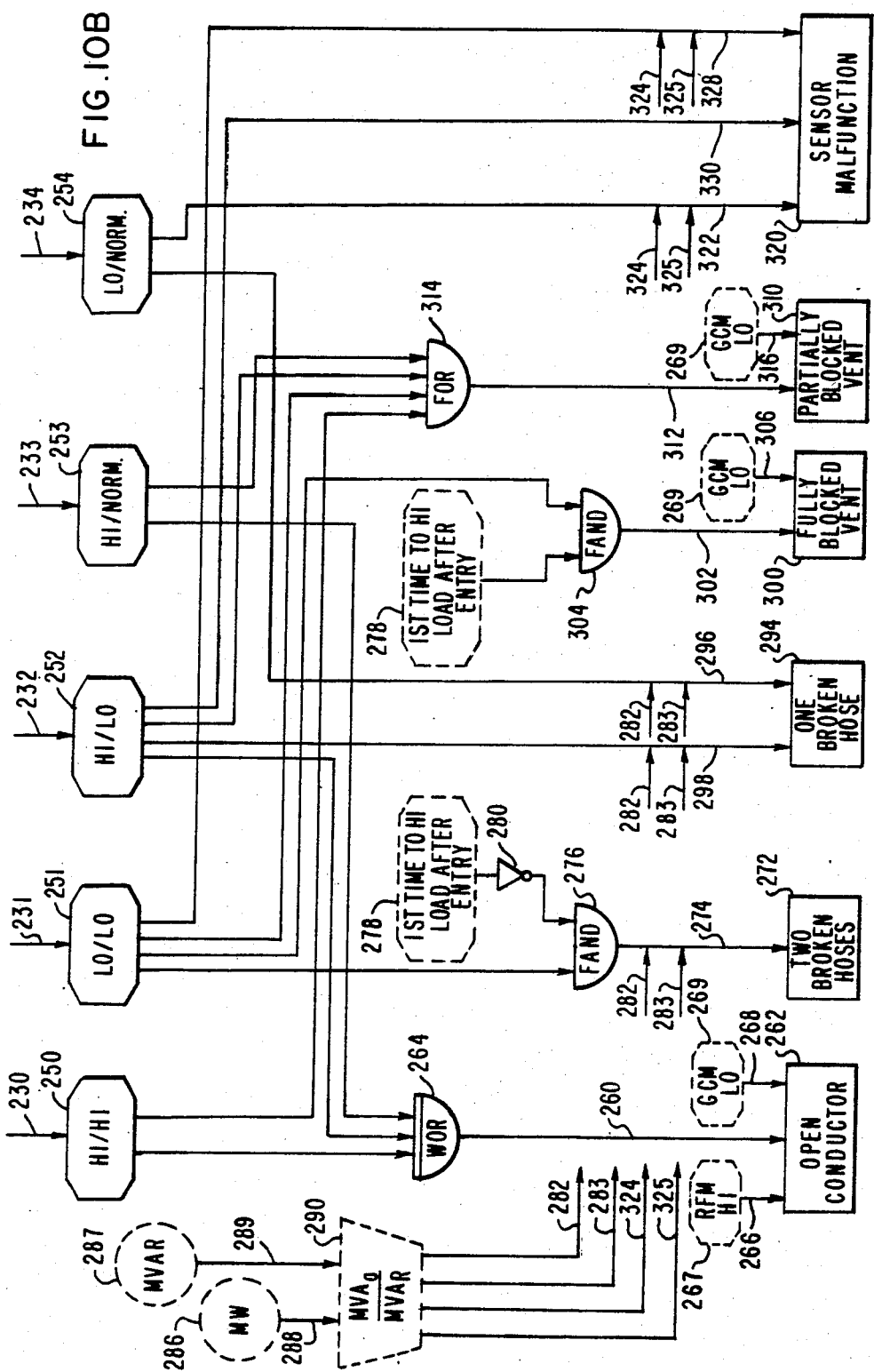

FIGS. 10A and 10B are a nodal diagram or flow chart illustrating the diagnostic process of the present invention for arriving at various generator abnormal conditions based upon RTD readings and implemented in accordance with the expert system previously described. The process is illustrated as being applied to two RTD sensors, a right one (r) and a left one (l) of any phase group and it is understood that the diagnostic process of FIG. 10 is repeated for all sensor pairs of the phase groups. The arrangement may represent one subsystem of a more comprehensive generator diagnostic system which examines generator components, other than the windings. Although only one sensor pair per phase group is illustrated, a sensor pair could be provided for other selected, or even all, of the coil sections.

As previously mentioned, the PAR value is a normalized value and is commonly obtained by adding a correction factor (to compensate for slight differences between detectors) to a raw temperature reading, dividing by the average temperature of all detectors and multiplying by 100. Thus if a compensated temperature reading is equal to the average, for a particular load level, the PAR value will be 100% instead of a temperature value. The PAR value is utilized by way of example herein, it being understood that other temperature representative values could be used, if desired.

Sensor nodes 150 and 152 are at the first level of diagnosis for the particular subsystem of FIG. 10 and receive respective normalized PAR values associated with the right and left sensors as in FIG. 3 and calculated, for example, by the diagnostic computer 106 or other means (FIG. 6A or 6B). Sensor node 150 supports rule 154 which utilizes a predetermined function to map the PAR-r value into a confidence factor that the value is higher than a normal range, as depicted at node 156. The PAR-r value is also tested by rule 158 to map the value into a confidence factor that the value is in fact lower than a normal range, as depicted at node 160.

A similar process is performed on the PAR-1 reading of node 152 to determine by rules 162 and 164 whether the value is high or low as depicted at respective nodes 166 and 168.

Normally, in the absence of any sensor abnormality, confidence in a high PAR-r reading would be propagated unaltered by rule 170 to a validated high node 172 and confidence in a low PAR-r reading would be propagated unaltered by rule 174 to a validated low node 176. In the presence of an RTD abnormality, however, the confidence in the high and low readings must be reduced and one way of accomplishing this reduction is by a technique utilized in copending application Ser. No. 636,195, filed July 31, 1984, and described in detail and claimed in copending application Ser. No. 636,196, filed on that same date.

Basically, the modification of the confidence is accomplished by a paralt (parametric alteration) rule which is operable to change the sufficiency function and/or necessity function of another rule. If the particular RTD which is utilized to obtain the PAR-r value is defective, as indicated by malfunction node 180, then paralt rule 182 will change the sufficiency of rules 170 and 174 to modify the propagation of belief in a high and low PAR value. In the absence of a defective RTD, the sufficiency of these rules, 170 and 174 remains unaltered so as to establish a validated high and low reading as depicted at nodes 172 and 176.

If the sensor electronics should slowly drift, a temperature indication provides thereby would be in error, but within a known range of operation. If however an RTD should suddenly degrade such as by opening, then its resulting temperature indication would be well out of the known range. One way of testing for a defective RTD to arrive at an abnormality as depicted at malfunction node 180 therefore is by testing the RTD temperature Tr, placed into a sensor node 184, to see whether it exceeds valid operational limits. A piece-wise linear rule 186 is utilized in arriving at a defective RTD determination from the temperature reading.

In a similar fashion, belief in a high or low PAR-1 value is propagated by rules 190 and 192 to respective validated high and low nodes 194 and 196. As previously explained, this propagation may be modified by changing the sufficiency of rules 190 and 192 by means of a paralt rule 198 operational to make the change when a defective RTD, utilized in calculating the PAR-1 value is determined, by defective RTD node 200. This defective condition in turn is determined utilizing the value of the RTD temperature $T_l$ of sensor node 202 in conjunction with a piece-wise linear rule 204.

If a PAR value is neither high nor low, then it must be normal. The existence of a normal reading is utilized in the diagnostic process illustrated in FIG. 10 and the determination of a normal reading may be accomplished utilizing validated high and low readings. For example, a FAND logic function 210 is illustrated having two inputs negated by not elements 212 and 213. A normal reading may be arrived at, as indicated by node 216 by means of rule 218. In other words, the belief that PAR-r is normal is determined from the evidence that the reading is not high as well as not low. Similarly, rule 220, in conjunction with FAND 222 and not functions 224 and 225 utilizes the evidence that PAR-1 is not high as well as not low to arrive at the determination of normalcy as indicated by node 226.

Thus having obtained validated hypotheses relative to the high, low or normal values of both the right and left PAR's, the diagnostic apparatus then utilizes a plurality of rules, 230 to 234, including a series of logic functions 236 (each appropriately marked as to its funtion) to determine the confidence factors of various combinations of the readings.

For example, rule 230 adds together the beliefs that each of the two PAR's are high, this conclusion being illustrated as the high/high node 250. Rule 231 adds together the beliefs that both of the PAR's are low as depicted at the low/low node 251.

If one of the PAR's is high and the other is low, rule 232 will map this belief into a high/low conclusion of node 252. In a similar fashion, rule 233 is utilized for the determination of a high/normal condition, depicted at node 253 while rule 234 is utilized for a low/normal condition as depicted at node 254. It is to be noted that these latter three conditions 252, 253 and 254 do not have to specify which of the readings, left or right, is high or low or normal but only that the particular combination exists.

The different combinations presented at nodes 250 to 254 are utilized to arrive at some conclusion relative to the overall health of the generator phase group being monitored. A variety of abnormal conditions may occur during the operation of the generator and the diagnostic apparatus of the present invention will determine whether or not a particular condition is occurring and present its conclusion, with a certain degree of confidence, to the operator so that corrective action may be taken if necessary.

FIG. 10 illustrates by way of example and not by way of limitation, several abnormal conditions which may be diagnosed by the apparatus utilizing the combinatorial readings depicted at nodes 250 to 254.

During on-line operation of the generator, there exists the possibility that one or more current carrying conductors may open. Rule 260 therefore is provided leading to the conclusion of an open conductor abnormality as depicted at malfunction node 262. The rule utilizes a weighted OR function 264 to take into account various types or patterns of conductor breakage. For example, and with additional reference to FIG. 3, if an entire conductor group should open or become separated from a soldered sleeve connector, the remaining conductor groups will pick up and carry the open conductor group's current. Since the remaining conductor groups are carrying more current than under normal conditions, more heat is generated because of the $I^2R$ losses, resulting in higher than normal PAR values for both the right and left sensors. This type of breakage is a distinct possibility and accordingly the high/high indication of node 250 is given the high weighting factor of 1 in the weighted OR function 264.

If just several conductor strands of a group should open in the half coil being monitored, then the current distribution will be such that the cooling gas passing through the vent tube stack on the side of the half coil having the open strands will heat up slightly while the cooling gas passing through the other vent tube stack will be relatively unaffected. The result of the strand breakage accordingly is that one PAR will be high while the other will be normal and this combination, at node 253, is given a relatively high weighting factor of 0.9 in the weighted OR function 264.

Another possibility which may occur is one which results in all of the conductor groups surrounding a particular vent tube stack being open circuited such that all of the current would be carried by the remaining conductor groups surrounding the other vent tube stack. The cooling gas passing through this latter vent tube stack will result in a high PAR reading while the other PAR reading will be low since the conductors surrounding the vent tube stack are not carrying current and accordingly, the cooling gas does not heat up. The chance of this latter condition, however, is not as prevalent as the other types of conductor open circuiting and accordingly is given a relatively lower weight of, for example, 0.5 in the weight OR function 264.

If a conductor is open, chances are likely that arcing will be produced at the discontinuity. In addition, since the coils may be heating up, detectable particulate matter may be generated. Accordingly, these two factors are utilized in the determination of an open conductor abnormality. Rule 266 relates the open conductor abnormality to a high RFM reading depicted at rule 267, while node 268 relates the open conductor abnormality to a low GCM reading depicted at node 269. Belief in a high RFM reading and a low GCM reading (both of which indicate abnormal conditions), of nodes 267 and 269 may be established in a separate subsystem which validates the RFM and GCM readings. Hypotheses generated in another subsystem are shown in FIG. 10 in dotted form.

Again with additional reference to FIG. 3, if for some reason, both of the hoses in the coils where 86r and 86l are found should break, the heated cooling gases would not be conducted to the respective RTD's 90r and 90l. In such situation, the RTD's would be reading the temperature of the ambient environment which, for high load conditions, would be cooler than the gas emanating from the vent tube stacks. This abnormal condition is depicted at node 272 and is identified by both PAR values being low, as at node 251, coupled with the fact that the incident is not occurring at the time that the generator is reaching a high load for the first time after it has been entered during a shutdown. This is depicted by rule 274 which utilizes the FAND function 276. The input relating to the first time to high load after entry into the generator is provided at node 278, the fact being negated by not function 280. That is, if it is the first time to high load after entry, the presence of a low/low could indicate a different abnormal condition whereas if the generator has been running for some time at high load and a low/low condition should occur, it is probably the fact that both hoses experienced a rupture.

The conclusion that the system does have two broken hoses can only be made with a high degree of confidence if the system is operating at high loads for which the ambient temperature is relatively cool, to result in a low/low reading for the two PAR values. If the system is not operating at high load, the belief in the particular abnormal condition may be substantially eliminated by simply changing the sufficiency and necessity of rule 274 by means of respective paralt rules 282 and 283. In order to generate these paralt rules, use may be made of two sensors normally provided with the generator equipment, one sensor being a megawatt (MW) sensor and the other being a reactive megavolt ampere (MVAR) sensor. These readings are placed into respective sensor nodes 286 and 287 linked by respective rules 288 and 289 to storage node 290 which functions to compute an actual load indication $$MVA_a = \sqrt{(MW)^2 + (MVAR)^2}$$

and compare it to the rated MVA, to arrive at a load level indication. If the load level indication is, by way of example, less than 60%, paralt rules 282 and 283 will function to decrease the sufficiency and necessity values of rule 274. If the load level is greater than 60%, indicative of a high load, then nothing is done to change the sufficiency and necessity of rule 274.

Another abnormal condition is depicted at node 294 and describes the situation where only one of the two hoses are broken. In such situation, a normal PAR value will be provided by one RTD while the other RTD will be reading the lower temperature of the ambient atmosphere to derive a low PAR value, as indicated at node 254 linked to the malfunction node by means of rule 296. As was the case with respect to rule 274, paralt rules 282 and 283 will change the sufficiency and necessity of rule 296 should the load level not be at its high value.

If a hose should break at the same time that a conductor breaks, then one RTD measurement will result in a low PAR value (at high loads) while the other RTD measurement will result in a high PAR value. This situation is depicted by rule 298 linking the high/low combination of node 252 to the one broken hose condition at 294. It is believed that the combination of one broken hose with a broken conductor is not very likely and accordingly, the sufficiency and necessity of rule 298 will have low values which will be reduced even furthr by operation of paralt rules 282 and 283.

During the initial assembly of the generator, or during its refurberation, masking tape is often put on the ends of the vent tubes to prevent entry of paint and/or debris. If the tape is accidentally left in place covering the vent tubes of the coil being monitored, then, when the generator attains high load for the first time after assembly or refurberation, the RTD's will be sensing the relatively low ambient temperature, resulting in two low PAR values. This abnormal condition of a fully blocked vent is depicted at node 300 and is supported by rule 302 which utilizes a FAND function 304 on the low/low indication of node 251 and the first time to high load after entry indication from node 278. This scenario presupposes a blockage at the inlet end of the vent tubes. Any masking tape on the outlet end which might prevent gas flow would, to a high degree of certainty, be removed by the gas flow pressure differential.

In a fully blocked condition, the coil would heat up thereby causing particulate matter which is detectable by the GCM. Accordingly, the fully blocked vent abnormal condition is additionally supported by rule 306 which increases confidence in a fully blocked vent due to a low GCM reading of node 269.

The abnormal condition of node 310 takes into account the situation where the vent tubes may not be totally blocked but only partially blocked. This condition can occur not only during assembly or refurberation, but during actual on-line operation of the generator where parts and/or material may work loose and partially block the vent tubes. Rule 312, utilizing a FOR function 314 takes into account various combinations of PAR values which may be caused by different patterns of partial blockage. For example, both right and left vent tube stacks may be partially blocked whereby the flow of cooling gas is restricted. This restricted gas flow causes the cooling gas to heat up resulting in a high PAR value for both the left and right sides. Accordingly, the high/high indication of node 250 is one combination which is taken into account.

If one side should additionally have a total blockage of the individual vent tube connected to the hose, then the RTD for that side will register low since it will be reading the cool ambient while the other RTD will be reading a high temperature resulting in a high/low indication of node 252.

The third consideration of rule 312 is the high/normal situation of node 253 whereby some of the tubes of one vent tube stack are partially blocked resulting in a high PAR value while the other vent tube stack has an insignificant blockage which may cause a slightly higher PAR reading for that side but still within a normal range.

Included in the FOR function consideration is the belief in a low/low PAR value of node 251, a situation which may be caused by partial blockage of both vent tube stacks with a total blockage of the individual tube leading to the RTD for both the left and right vent tube stacks.

In any condition of a partial block, overheating would cause particulation such that the abnormal condition defined at node 310 is supported by a low GCM reading, 269 linked by rule 316.

The last abnormal condition depicted in the examples of FIG. 10 is that of node 320 which defines a sensor malfunction. In this respect, a sensor is defined as the apparatus which is utilized to obtain a temperature reading. In FIG. 6A or 6B, the sensor would include not only the RTD but the associated scanning and conversion circuitry for calculating the respective temperatures from the RTD resistances.

If a high belief in a low/normal indication (node 254) should occur while the generator is operating at high load, in all probability, the combination is due to a single broken hose. If, however, the generator is not operating at high loads, then there would be no logical reason for the low/normal combination to exist and accordingly, the fault probably lies with one or both of the sensors. This correlation is established by rule 322 which has its sufficiency and necessity increased by paralt rules 324 and 325 if the result of the operation of storage node 290 results in a load level less than 60%. If the load level in fact is high, that is, greater than 60%, the sufficiency and necessity of rule 322 will remain low.

A higher belief in the low/low combination of node 251 can, at high loads, be indicative of two broken hoses or a fully blocked vent. At low loads, however, the ambient temperature is not low and therefore, the low/low indication may be indicative of a sensor malfunction, with this relationship being defined by rule 328, the sufficiency and necessity of which will be increased, as rule 322, by paralt rules 324 and 325 when the load is low.

The final rule in the example, rule 330, relates a high/low indication to a sensor malfunction. As previously described, a high/low indication could possibly be indicative of an open conductor malfunction, however, this possibility was given relatively little weight. Similarly, the high/low combination could be one broken hose, in combination with an open conductor, the situation which, although accounted for, is not highly likely. Accordingly, a third possibility for a high/low combination would be a malfunctioning sensor.

Of course, the possibility of a sensor malfunction can exist with any combination including a normal/normal combination; the three examples presented in FIG. 10 are considered the most likely.

If a sensor malfunction is indicated, it can be checked with relative ease by manually taking resistance readings of the RTD's at the terminal board 100. At this point, it is assumed that the RTD's are not inoperative since such condition would have shown up earlier at nodes 180 or 200. The resistance values may then be converted to respective equivalent voltages corresponding to the temperatures measured by the RTD's. These tempeature indicative voltages are input to the computer which then calculates the respective PAR values. If the high belief in the combination triggering the sensor malfunction indication, disappears as a result of the manual inputting of temperatures, then it is known that in actuality, there is a sensor malfunction for which corrective action may be taken by the operator.

What is claimed is:

1. Diagnostic apparatus for diagnosing the winding system of an electrical generator having a plurality of coil sections with internal first and second vent tube stacks through which a cooling gas is passed, comprising:
   (A) monitoring means for monitoring the temperature of cooling gas emerging from said first and second vent tube stacks of selected ones of said coil sections and operable to provide corresponding first and second temperature indicative signals;
   (B) diagnostic computer means being responsive to said first and second temperature indicative signals and operable to generate therefrom corresponding first and second normalized temperature indicative signals and to determine whether said normalized temperature signals fall within or outside of a normal range;
   (C) said diagnostic computer means being additionally operable to generate indications of the existence of predetermined combinations of said normalized signals in and out of said range;
   (D) said diagnostic computer means being responsive to said existence of said predetermined combinations to generate therefrom indications of predetermined possible abnormal conditions of said coil section being monitored; and
   (E) means for communicating said abnormal condition indications to an operator.

2. Apparatus according to claim 1 wherein:
   (A) said first and second normalized temperature signals may be either high, low or normal, depending upon whether they are higher than, lower than or within, said normal range; and
   (B) said predetermined combinations include a high/high, a low/low, a high/low, a high/normal and a low/normal combination.

3. Apparatus according to claim 1 wherein:
   (A) said winding system includes a plurality of phase winding groups; and wherein
   (B) a said monitoring means is provided for each said phase winding group.

4. Apparatus according to claim 3 wherein:
   (A) said monitoring means is provided for only one coil section of each said phase winding group.

5. Apparatus according to claim 1 which includes:
   (A) a radio frequency monitor for detecting the existence of electrical arcing within said winding system and to provide a corresponding output signal indicative thereof;
   (B) a generator condition monitor for detecting the existence of particulate matter in said cooling gas produced by overheating of said winding system and to provide a corresponding output signal indicative thereof;
   (C) said diagnostic computer means being additionally responsive to said radio frequency monitor and generator condition monitor output signals as well as said predetermined combinations, to generate indications of particular ones of said predetermined abnormal conditions.

6. Apparatus according to claim 1 which includes:
   (A) means for determining the operating load level of said generator;
   (B) said diagnostic computer means being additionally responsive to said operating load level, as well as said predetermined combinations to generate indications of particular ones of said predetermined abnormal conditions.

7. Apparatus according to claim 1 wherein:
   (A) one of said predetermined abnormal conditions indicates an open electrical conductor within said winding system.

8. Apparatus according to claim 1 wherein:
   (A) said monitoring means includes first and second temperature detectors; and which includes
   (B) first and second gas conduits for respectively conducting said emerging cooling gas from said first and second vent tube stacks to said first and second detectors; and wherein
   (C) one of said predetermined abnormal conditions indicates a broken one of said gas conduits.

9. Apparatus according to claim 8 wherein:
   (A) one of said predetermined abnormal conditions indicates a break in both of said gas conduits.

10. Apparatus according to claim 1 wherein:
    (A) one of said predetermined abnormal conditions indicates a complete blockage of said first and second vent tube stacks.

11. Apparatus according to claim 1 wherein:
    (A) one of said predetermined abnormal conditions indicates a partial blockage of said first and/or second vent tube stacks.

12. Apparatus according to claim 1 wherein:
    (A) one of said predetermined abnormal conditions indicates a malfunction in said monitoring means.

13. Diagnostic apparatus for diagnosing the winding system of an electrical generator having a plurality of coil sections with internal first and second vent tube stacks through which a cooling gas is passed, comprising:

(A) monitoring means for monitoring the temperature of cooling gas emerging from said first and second vent tube stacks of selected ones of said coil sections and operable to provide corresponding first and second temperature indicative signals;

(B) diagnostic computer means being responsive to said first and second temperature indicative signals and operable to generate therefrom corresponding first and second normalized temperature indicative signals;

(C) said diagnostic computer means being further operable to test said normalized signals to see if they fall below, within or above a normal range and to generate respective confidence factors in the existence of a said signal being below, within or above said normal range;

(D) said diagnostic computer means being responsive to said confidence factors and operable to generated respective confidence factors in the existence of various predetermined combinations of said signals below, within or above said normal range;

(E) said diagnostic computer means being responsive to said confidence factors in the existence of said predetermined combinations to generate respective confidence factors in the existence of predetermined abnormal conditions as a function of the existence of various ones of said combinations; and (F) means for communicating said latter confidence factors together with their corresponding abnormal condition indication, to an operator.

14. Apparatus according to claim 13 wherein:

(A) said monitoring means includes first and second temperature detectors;

(B) said diagnostic computer means being operable to test the condition of said detectors and if faulty, to reduce the confidence in the existence of a signal below, within or above said normal range.

* * * * *